US008283979B2

(12) United States Patent
Stanley

(10) Patent No.: US 8,283,979 B2
(45) Date of Patent: Oct. 9, 2012

(54) AMPLIFIER SYSTEM FOR A POWER CONVERTER

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 13/009,335

(22) Filed: Jan. 19, 2011

(65) Prior Publication Data

US 2012/0182069 A1 Jul. 19, 2012

(51) Int. Cl.
*H03F 3/217* (2006.01)
*H03F 3/36* (2006.01)

(52) U.S. Cl. .......................... 330/251; 330/10
(58) Field of Classification Search ............... 330/10, 330/251, 207 A
See application file for complete search history.

(56) References Cited

U.S. PATENT DOCUMENTS 6,351,018 B1   2/2002  Sapp ........................ 257/499
7,268,621 B2 *  9/2007  Kanoh et al. ............. 330/251

FOREIGN PATENT DOCUMENTS

EP  0 720 295 A2  7/1996
JP  6-177335  6/1994

OTHER PUBLICATIONS

Modeling Digital Substrate Noise Injection in Mixed-Signal IC's, E. Charbon, P. Miliozzi, L.P. Carloni, A. Ferrari and A. Sangiovanni-Vincentelli, IEEE Trans. on Computer-Aided Design of Integrated Circuits and Systems, vol. 18, No. 3, Mar. 1999.
Analog Design for CMOS VLSI Systems, F. Maloberti, Kluwer Academic Publishers—2001 pp. 19-26.
TPA3001D1 Datasheet, Texas Instruments, Dec. 2002.
Characteristics and Limitations of Transistors, R.D. Thornton, D. DeWitt, E.R. Chenette and P.E. Gray, SEEC, vol. 4, Fig. 1.21, Nov. 1966, 2 pgs.
European Search Report dated, May 3, 2012, pp. 1-5, European Patent Application No. 12151655.3-1233, European Patent Office, Germany.

* cited by examiner

*Primary Examiner* — Robert Pascal
*Assistant Examiner* — Khiem Nguyen
(74) *Attorney, Agent, or Firm* — Brinks Hofer Gilson & Lione

(57) ABSTRACT

An amplifier system for a power converter includes at least a first switching device and a second switching device formed in an integrated circuit in a substrate of a semiconductor. The first and second switching devices may be formed in a half bridge configuration and may be cooperatively switchable to generate an amplified output signal on an output node of the semiconductor. A resistor and a capacitor may be coupled in parallel between a power supply input node and a substrate node included in the semiconductor. The capacitor may be selectively charged to a de-biasing voltage during a switching cycle of the first and second switching devices to reverse bias a parasitic switching device appearing in the integrated circuit.

27 Claims, 6 Drawing Sheets

AMPLIFIER SYSTEM FOR A POWER CONVERTER

BACKGROUND OF THE INVENTION

1. Technical Field

This invention relates to power converters, and more particularly to an amplifier system in a power converter that reduces parasitic switching device activity.

2. Related Art

Integrated circuits deploying power electronics and associated circuitry enable cost effective solutions to complex problems in power management. Having thousands of active devices and their interconnections built into one monolithic semiconductor element makes for very efficient systems packaging with a minimum of materials and unreliable connections.

The principle limitations of such devices come in the form of not being able to store large amounts of energy (capacitor and inductor sizes are limited) and the intimate placement of multiple devices within one assembly leads to unintended signals (currents) being coupled from high current members to other signal portions of the circuitry. Parasitic elements such as unintended bipolar transistors formed adjacent to power MOSFETs typically limit the voltage and current levels at which the MOSFETs may reliably operate without destruction.

SUMMARY

An amplifier system minimizes activity of parasitic switching devices by reverse biasing at least one parasitic switching device appearing in a substrate of a semiconductor included in the amplifier system. The amplifier system includes switching devices formed in an integrated circuit in a substrate of the semiconductor as power switches, such as power MOSFETS. The switching devices may include a first switching device and a second switching device that are cooperatively switchable in a half bridge power stage configuration to generate an amplified output signal on an output node of the semiconductor. The semiconductor may also include a power supply input node for receiving a power supply voltage and a substrate node coupled with the substrate.

A resistor and a capacitor may be coupled in parallel between the power supply input node and the substrate node. The capacitor may be charged to a de-biasing voltage during a switching cycle of the first and second switching devices to reverse bias any parasitic switching devices that appear. The capacitor may be charged with a free-wheeling current that occurs during a time of a switching cycle of the first and second switches (a free-wheeling portion) when both the first and the second switching devices are not substantially conducting.

In one example configuration, the amplifier system may additionally include a diode coupled between the output node and the substrate node. The diode may be forward biased by the free-wheeling current to charge the capacitor. The diode may operate in conjunction with the resistor and capacitor as a shunt in parallel with a free-wheeling body diode included in one of the first switching device and the second switching device. A forward voltage of the diode may be less than a forward voltage of the free-wheeling body diode included in one of the first switching device and the second switching device so that the diode turns on and begins charging the capacitor before the free-wheeling body diode is turned on.

An interesting feature of the amplifier system is that the resistor, capacitor and diode (if present) may be external to the semiconductor in some example configurations. Accordingly, the output node, the power supply input node and the substrate node may each be brought out of the semiconductor to a respective external pin of the semiconductor.

Another interesting feature of the amplifier system is that any number of switching devices may be included. Accordingly, the amplifier system may include any number of half bridge power stages, or full bridge power stages. The resistor and capacitor may be a common charge/discharge circuit for each of the half bridge power stages or full bridge power stages.

Yet another interesting feature of the amplifier system is that the system can provide an inexpensive extension of a region of safe operation of the switching devices by keeping the parasitic switching devices substantially turned off. Extension of the region of safe operation of the switching devices can increase power output of the semiconductor. When the parasitic switching devices are kept off, not only are the regions of safe operation of the switching devices extended in terms of higher voltage and current, but also noise currents and electromagnetic interference (EMI) may be reduced. Noise current may result from extended free-wheeling body diode recovery times, and noise currents may result from dynamic avalanche at high voltages.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
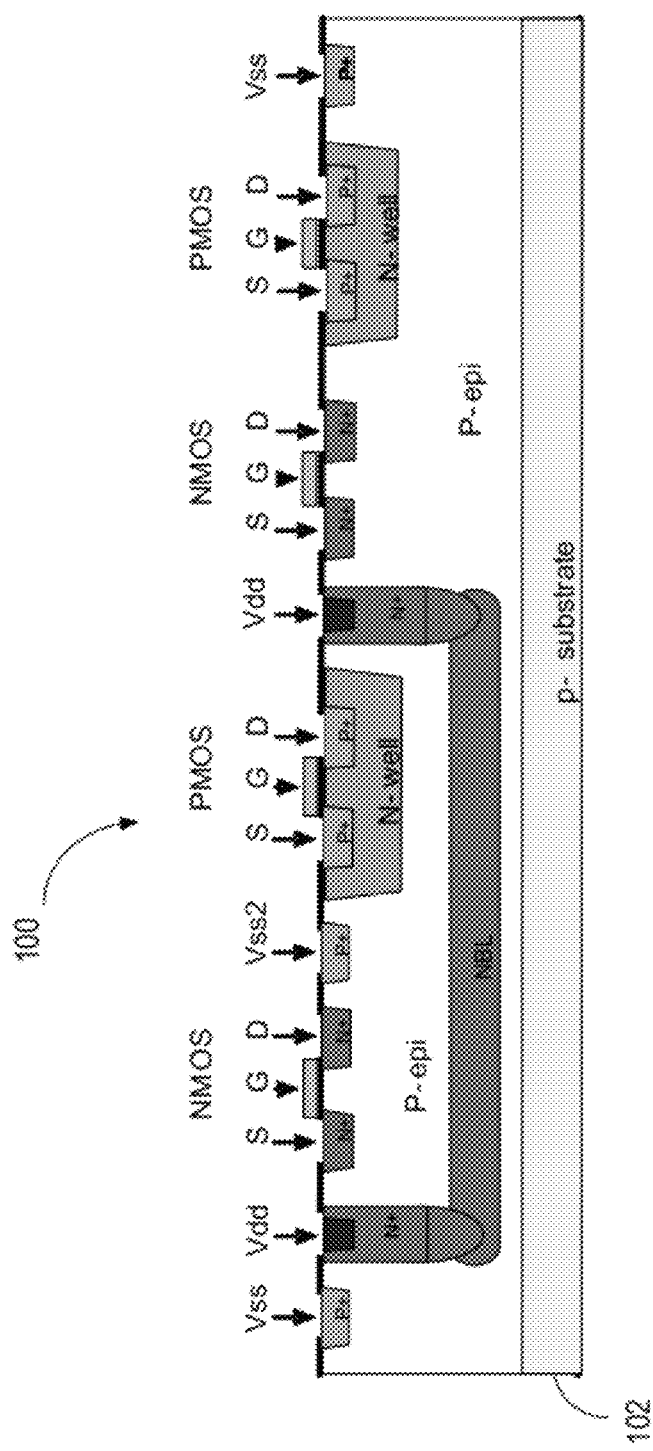
FIG. 1 is an example semiconductor architecture in the form of a CMOS integrated circuit architecture.

FIG. 1 is an example architecture for an integrated circuit (IC) 100 incorporated in a semiconductor 102, such as a complimentary metal oxide semiconductor (CMOS) power IC. The example power IC is built upon a lightly doped P-type substrate using more highly doped N-wells to confine switching devices, such as P-channel MOSFETs, built upon the same substrate. In other examples, the switching devices may be other devices, such as PNP bipolar junction transistors (BJT), an insulated gate bipolar transistor (IGBT), a thyristor, or any other form of power transistor, mechanism or device included in an integrated circuit and capable of transitioning between a conducting and a non-conducting state. Although the term "MOSFETS" is used in the following discussion, it should be understood that the switching devices are not limited to MOSFET switching devices. The N-wells could be biased, such as by a power supply, to be more positively biased than any circuitry contained within the IC 100. In other examples, the semiconductor may include P-wells in a lightly doped n-type substrate. In FIG. 1, NMOS devices may be built either directly on the substrate or within N tubs formed with deep N buried layers (NBL) supplied a positive supply voltage (Vdd) by a power supply. A negative supply voltage (Vss) supplied from a power supply may be applied to P-wells in the substrate.

The NMOS and PMOS devices may be formed in the substrate with a lateral structure in which the source (S), gate (G) and drain (D) are horizontally aligned. Alternatively, or in addition, NMOS and PMOS devices may be formed in the substrate with a vertical structure. The N-wells within P-epitaxial regions (P-epi) could also be used to contain resistors, small inductors and capacitors in addition to switching devices, such as MOSFETs. Isolation using silicon on insulator (SOI) approaches rather than a p-type substrate with N-layer isolation may also be used.

Figure 2:
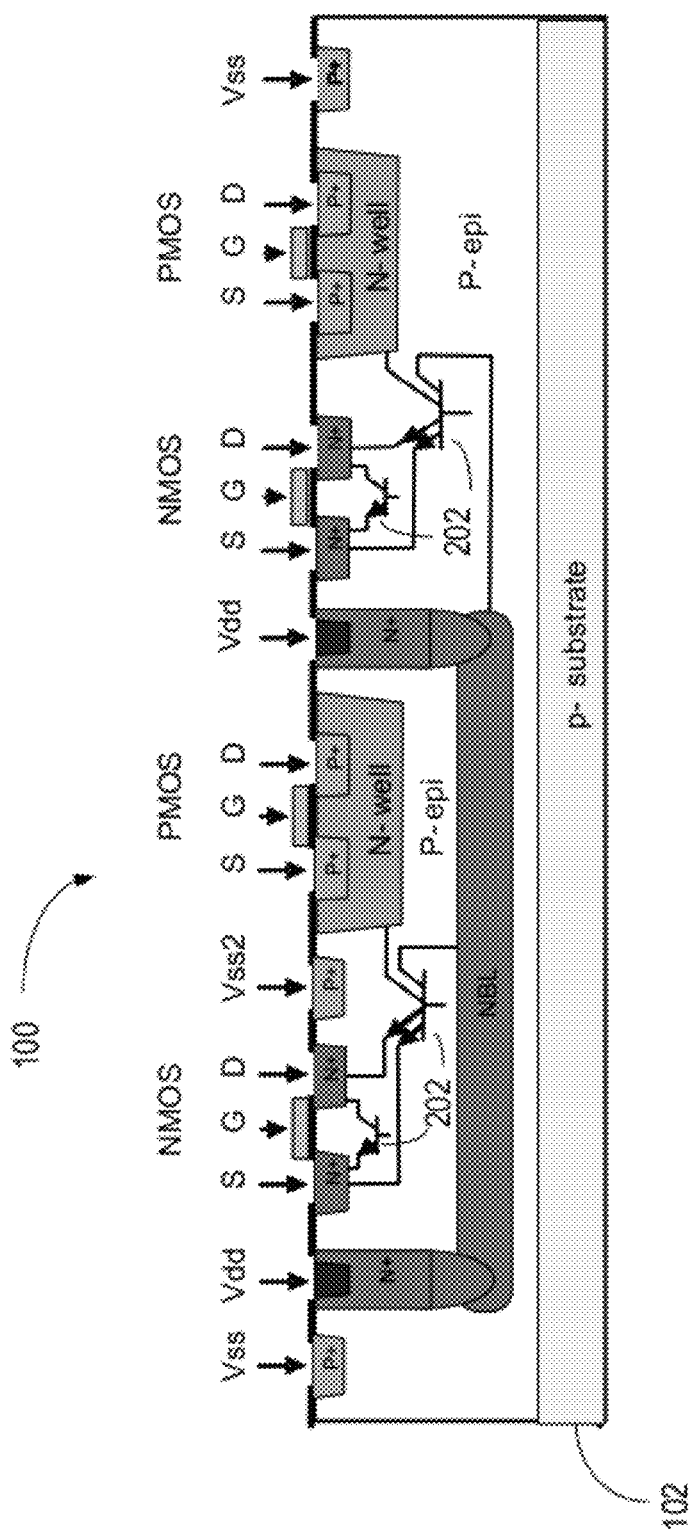
FIG. 2 is the example semiconductor architecture of FIG. 1 with examples of parasitic switching devices illustrated.

The monolithic nature of the construction creates parasitic devices. Some examples of parasitic bipolar devices 202 are indicated in FIG. 2. Switching devices, such as MOSFETs, can inherently contain a parasitic switching device, such as a parasitic bi-polar junction transistor (BJT) that can be local to each switching device. Although the term "BJT" is used in the following discussion, it should be understood that the parasitic switching devices should not be limited to a BJT, and may be any form of parasitic switching device. Not all of the parasitic NPN BJTs are shown in FIG. 2 that may appear in an actual IC, however, those shown in FIG. 2 can represent significant limitations to robust functioning of the IC. It is typical that the high current breakdown voltages of parasitic switching devices are considerably lower than the breakdown voltages of the switching devices of which they are a part. For example, at low BJT collector currents the breakdown voltages are the equal of the MOSFET drain to source breakdown voltages (BV dss) but not at high BJT collector currents. Therefore parasitic switching device currents, such as BJT collector currents, should be prevented from becoming large.

Conduction by such a parasitic switching device can be minimized by design. In one example, when the substrate of the semiconductor is joined/shorted to the source of a MOSFET, currents injected into the substrate tend to be returned to the source rather than allowed to enable the parasitic BJT. There can be three major sources of charge to the base of the parasitic transistors.

1. Displacement/capacitive current from a rapidly increasing drain-to-source voltage ($V_{ds}$).
2. Charge left in the region by previous forward biasing of the drain to substrate junction.
3. Hot-carrier current (minority carriers) resulting from high electric fields in the region of the drain.

Capacitance between the drain and the substrate provides a significant turn-on current for the parasitic BJT that can be at least partially contained by a MOSFET design that effectively routes the current to the source lead of the MOSFET. This turn-on current, however, is not the only current that acts to enable a parasitic BJT.

Power converters, such as audio amplifiers may use power ICs to drive a load. In some examples, power converters using power ICs can drive into inductive loads, such as loudspeakers, using width modulation of high-frequency pulsed signals to provide nearly-lossless controlled delivery of energy to the inductive load. A class-D audio amplifier is an example of one such power converter.

Figure 3:
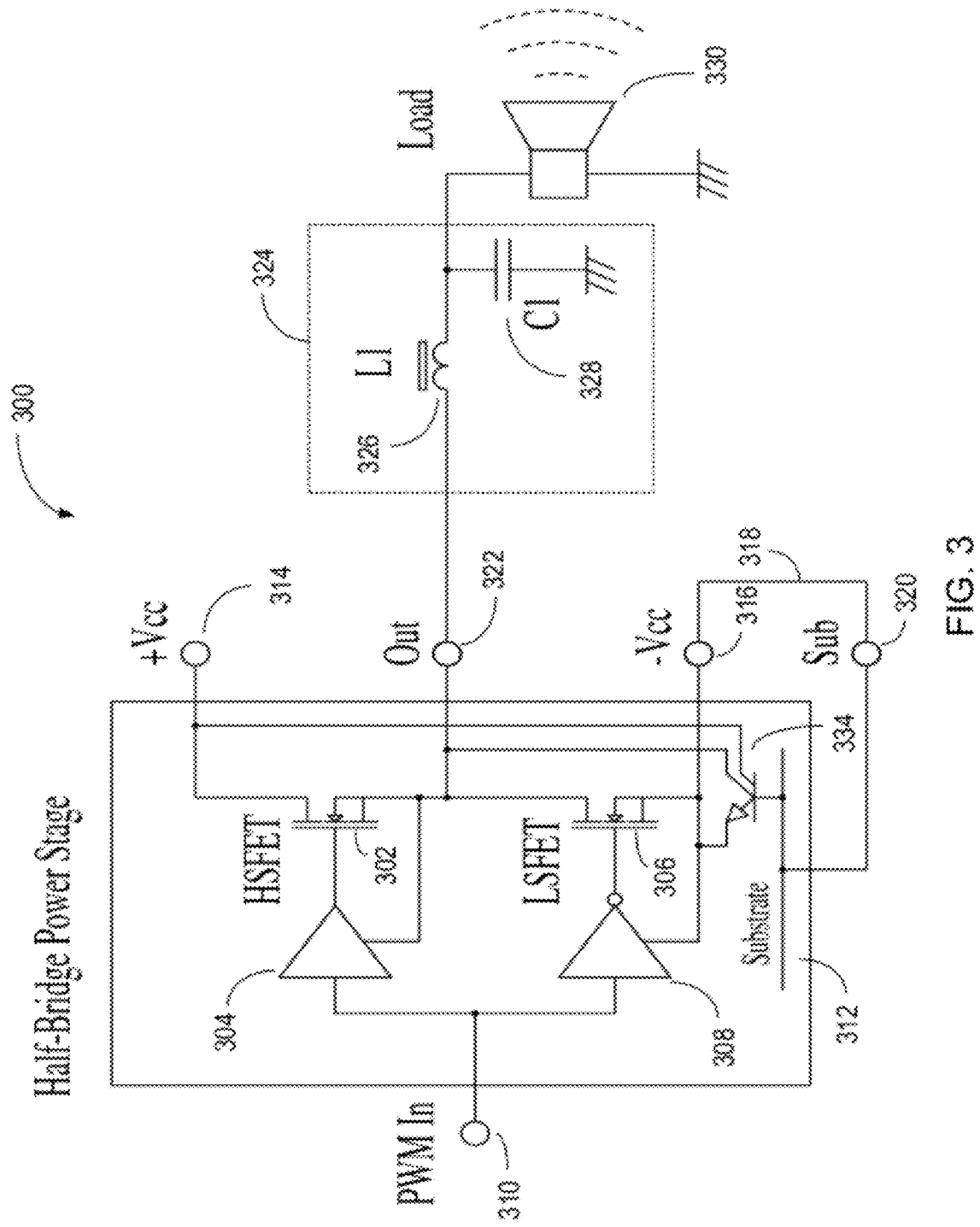
FIG. 3 is a circuit schematic of an example amplifier system that includes a half-bridge power stage.

FIG. 3 is an example amplifier system 300 having a half bridge power stage that may be included in a power converter. The half-bridge power stage may be implemented with a first switching device 302 driven by a first gate driver 304, and a second switching device 306 driven by a second gate driver 308. The first and second gate drivers 304 and 308 may drive the respective first and second switching devices 302 and 306 based on an input signal provided to an input node 310. The input node 310 may be an external pin on the semiconductor, or may be a part of the integrated circuit, which receives the input signal.

The input signal may be one or more control signals, such as pulse width modulated signal. In an example of an audio amplifier system, the input signal may be a pulse width modulating signal generated by comparing a triangle wave to an audio signal using a high speed comparator to generate a series of pulses of varying width depending on the instantaneous amplitude of the audio signal. Alternatively, in another audio amplifier system example, a digital signal processor may generate the pulse width modulating signal based on an audio signal. The power converter may include other devices and systems, such as processors, memory, filters, a user interface, a communication interface, or any other functionality included in power converters, such as an audio amplifier.

The first and second switching devices 302 and 306 may be power MOSFETS included as part of an integrated circuit in a substrate 312 of a semiconductor. In a half-bridge configuration, the first and second switching devices 302 and 306 may be referred to as a high side switch (HSFET), and a low side switch (LSFET), respectively.

The integrated circuit may be supplied power from one or more external power supplies. In FIG. 3, a first power supply input node 314 may receive a positive power supply voltage (+Vcc) as an input voltage. The first power supply input node 314 may include an external pin on the semiconductor that is also coupled internal to the IC through the substrate 312 with the first switching device 302. A second power supply input node 316 may receive a negative power supply voltage (−Vcc) as an input voltage. The second switching device 306 and the second gate drive 308 may be coupled through the substrate 312 with the second power supply input node 316 internal to the IC. The second power supply input node 316 may also include an external pin on the semiconductor.

The voltage received at the second power supply input node 316 may be a most negative power supply (−Vcc) of the amplifier half-bridge. Accordingly, the voltage received at the second power supply input node 316 may be the most negative supply voltage potential of the second switching device 306. In some examples, the most negative power supply (−Vcc) may be ground. In other power IC examples, the most negative power supply (−Vcc) may be greater than or less than zero volts. In still other examples, the power supply inputs may be reversed such that the first power supply input node 314 receives the negative power supply voltage (−Vcc), and the second power supply input node 316 receives the positive power supply voltage (+Vcc) based on whether the switching devices are N type or P type devices, such as NMOS and PMOS devices. Thus, in the following discussion, although not indicated, the positive and negative supply voltages may be interchanged.

In FIG. 3, the substrate 312 is coupled with the negative power supply (−Vcc) by a jumper circuit 318. The jumper circuit 318 forms a short circuit between the second power supply input node 316 and a substrate input node 320. The substrate input node 320 is in the form of an external pin that is external to the semiconductor. Accordingly, the shunt circuit 318 is external to the semiconductor. In other examples, the substrate 312 may be coupled to the negative power supply (−Vcc) by a shunt circuit 318 that is internal to the semiconductor and included within the IC.

During operation, the half-bridge power stage 300 generates an output signal on an output node 322, which may be provided as an external pin on the semiconductor. The output signal may represent the amplified input signal provided on the input node 310. The output node 322 may be coupled to one or more filters 324, such as a passive filter containing one or more inductors (L1) 326, and one or more capacitors (C1) 328. In other examples, an active filter, or any other type of filter may augment the filter 324. The filter 324 may also be included as part of the integrated circuit included in the semiconductor in other example configurations. Accordingly, in some examples, the output signal generated by the half-bridge power stage 300 may not be directly supplied to an external pin on the semiconductor. The output node 322 may also be coupled with a load 330. The load 300 may be any device capable of receiving the output signal. In FIG. 3, the load 330 includes one or more loudspeakers, which are driven by the output signal to produce audible sound.

During operation of the amplifier system 300 one or more parasitic switching devices 334, such as a parasitic BJT may appear in the integrated circuit (IC) contained in the semiconductor. In one example, the parasitic switching device(s) 334 may be parasitic NPN BJTs. During operation charge may be driven into the parasitic switching device 334 by current that flows when the first switching device 302 (high-side FET-HSFET) turns off and a portion of the current in the inductor 326 (L1) is forced to flow into the output node 322 and through the forward biased body diode or substrate diode of the second switch 306 (low-side FET-LSFET). The body diode or free-wheeling body diode may be included in each of the first and second switching devices 302 and 306 between a drain and a source of the respective switching device.

This portion of the conversion cycle when switching off either the first or the second switching device 302 or 306 and before switching on the alternate switching device (either the first or the second switching device 302 or 306) may be described as a free-wheeling portion of the cycle. In the case of the first switching device (HSFET) 302 being switched off, the free-wheeling portion of the cycle, without subsequent switching, would last until the current in the inductor 326 (L1) reverses direction due to the second switching device 306 (LSFET) conducting and supplying voltage and current on the output node 322. For example, the second switching device 306 may begin conducting in the direction where the FET channel is conducting using only majority carriers. At relatively high instantaneous output currents, the alternate switching device (FET) may turn on before the current reverses direction in the inductor 326 (L1).

The full turn-on of the parasitic switching device 334 can occur when the first switching device 302 (HSFET) is suddenly turned on with the free-wheeling current still flowing into the free-wheeling body diode of the second switching device 306 (LSFET). This may be referred to as a parasitic switching device charging event. In some cases, the parasitic switching device 334 may be biased on during the free-wheeling cycle but may lack sufficient collector potential to conduct enough current to pose a problem until the first switching device 302 (HSFET) turns on and forces voltage across the parasitic switch device 334, such as across a collector circuit of a parasitic BJT to detrimentally increase the current conducted.

In some examples, a portion of the parasitic switching device 334, such as a parasitic BJT's collector, may terminate on a guard ring. The guard ring may be a construct of the integrated circuit, and may be used to collect spurious current in order to minimize spurious cross talk in the IC. The guard ring may be biased with a positive (or negative) potential with respect to the substrate 312, such as being biased with at least a portion of the positive power supply (+Vcc). As such, the voltage across the parasitic switching device 334 may be even larger when free-wheeling current is still flowing into the body diode of the second switching device 306 (LSFET) and the first switching device 302 (HSFET) is suddenly turned on.

During operation, when the first switching device 302 (HSFET) begins to turn on hot-carriers may be generated near the drain of the first switching device 302 (HSFET). When the drain-source voltage of the first switching device 302 (HSFET) is sufficiently large, there is sufficient energy in the majority carriers (electrons) to dislodge electrons from the silicon lattice of the first switching device 302 (HSFET). The freed electrons join the flow towards the drain of the first switching device 302 (HSFET). Some of the resulting holes may flow into the substrate 312 and energize the parasitic switching device 334. The hole current may be proportional to the drain current and exponentially related to the drain-source voltage. The expression for hot-carrier current in the first switching device 302 (HSFET) may be provided in the form:

$$I_{impact} = \int_{E_s}^{E_m} I_d \cdot A \cdot e^{-B/E(x)} \cdot dx \qquad \text{Equation 1}$$

Where $E_s$ is the field at the source, $E_m$ is the maximum field and $E(x)$ is the local field along the integration path in x. $I_d$ is the drain current and A and B are semiconductor material related coefficients.

Since the voltage is high with high drain current (Id) only during the time that the first switching device 302 (HSFET) is recovering the body diode of the second switching device 306 (LSFET) and slewing the output node 322, the time dimensions of the hot-carrier event, or parasitic switching device charging event, may be limited. Unfortunately, the heightened recovery tail of the body-diode of the second switching device 306 (LSFET) (due to the turn on of the first switching device 302 (HSFET)) may increase the drain current (Id) well above the current needed to support the current in the inductor (L1) 326. If one attempts to minimize the time integral of the impact current ($I_{impact}$), which corresponds to a charge, such as a BJT base charge, of the parasitic switching device 334, by turning on first switching device 302 (HSFET) faster, then a magnitude of the drain current (Id) may be increased. An increase in the drain current (Id) of the first switching device 302 (HSFET) may offset many of the gains made by reducing the width of the hot-carrier pulse. In other words, an increased drain current (Id) reduces integration of charge during the shorter time of the hot carrier event (parasitic switching device charging event), however peak currents increase, so an amplitude of hot carriers increases resulting in additional charging and activation of the parasitic switching device 334.

Therefore anything allowing a reduction in the drain current $I_d$ of the first switching device 302 (HSFET) may reduce $I_{impact}$. While it may not be possible to eliminate $I_{impact}$, it may be possible to keep the drain current (Id) from activating the parasitic switching device 334, or minimize activation, during a parasitic switching device charging event. It may also be possible to use some of the large free-wheeling current that otherwise would have charged the parasitic switching device 334, such as charging the base region of a parasitic BJT, to deliver a charge to a temporary reservoir that can act to de-bias the parasitic switching device 334. In other words, a portion of the drain current (Id) of the first switching device 302 (HSFET) may be shunted or diverted to an alternative current flow path during the parasitic switching device charging event to avoid charging the parasitic switching device 334 to the point of turn on, or full turn on.

Figure 4:
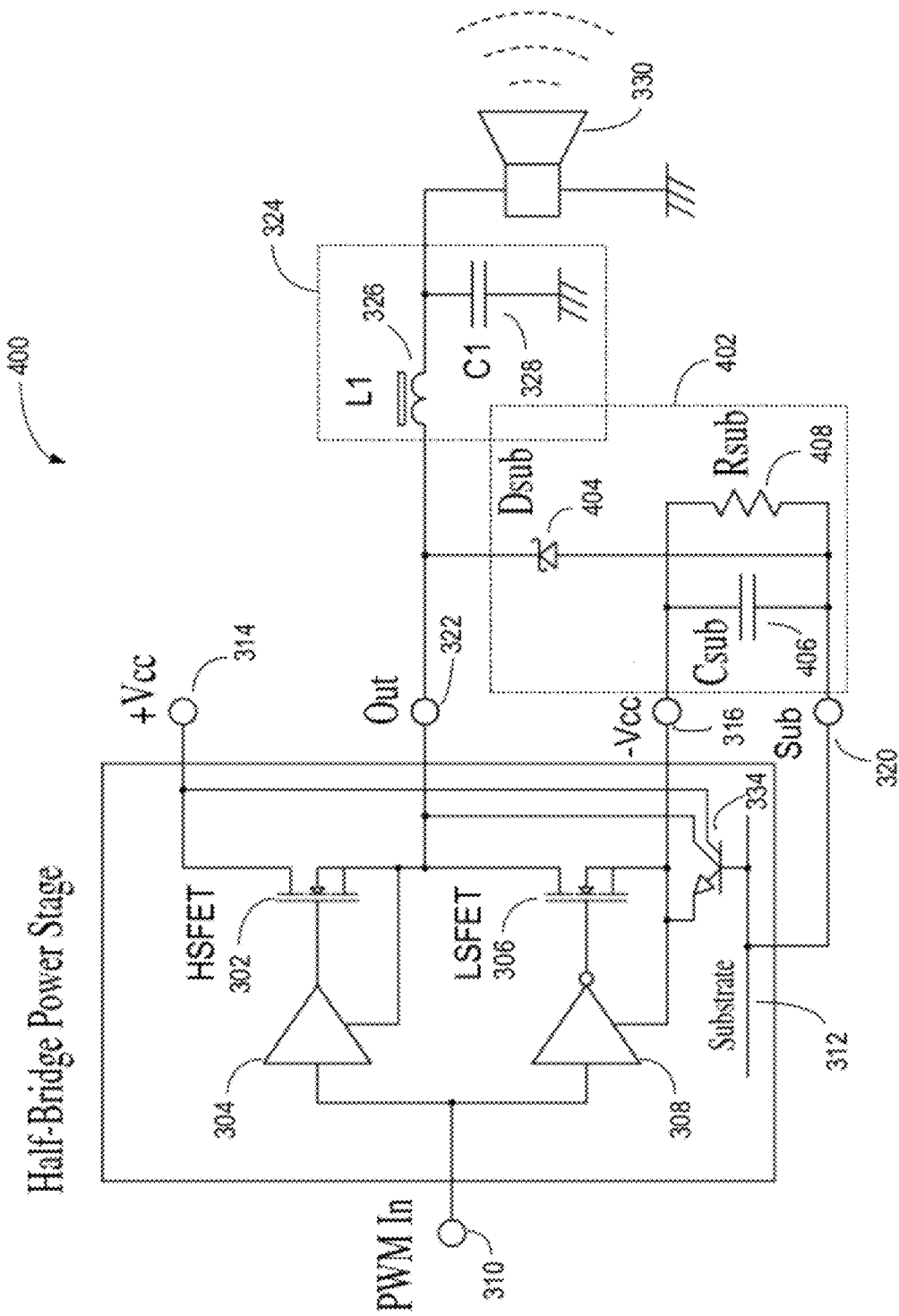
FIG. 4 is circuit schematic of the amplifier system of FIG. 3 that includes a shunt circuit.

FIG. 4 is another example amplifier system 400 having a half bridge power stage that may be included in a power converter. The half bridge power stage may include the first switching device 302 and the first gate driver 304, and the second switching device 306 and the second gate driver 308, formed in the substrate 312. The input node 310 may received an input signal, such as a pulse-width modulated signal, and the output node 322 may provide an amplified output signal formed by amplification of the input signal using the first and second switching devices 302 and 306. The output signal may be provided to one or more filters 324 and supplies one or more loads 330. Accordingly, the amplifier system 400 is similar in many respects to the previously discussed amplifier system 300 described with reference to FIG. 3. For purposes of brevity, the previous discussion will not be repeated, but may be wholly or partially applicable.

In FIG. 4, the amplifier system 400 includes a shunt circuit 402 that acts to de-bias the parasitic switching device 334, such as a parasitic BJT, by using the free-wheeling cycle of the half-bridge power stage to advantage. The shunt circuit 402 may include a diode (Dsub) 404, a capacitor (Csub) 406, and a resistor (Rsub) 408. The shunt circuit 402 may be parallel to the free-wheeling body diode of the second switching device 306.

The diode (Dsub) 404 may be coupled between the output node 322, and the substrate node 320. The diode ($D_{sub}$) 404 may be any diode capable of having a reverse blocking voltage rating of at least a difference in voltage magnitude between the positive power supply voltage (+Vcc) and the negative power supply voltage (−Vcc) received at the first power supply input 314, and a forward voltage (Vf) which is less than the forward voltage (Vf) of the body diode or substrate diode of the second switching device 306 (LSFET). In one example, the diode (Dsub) may be a Schottky diode.

The diode (Dsub) 404 may be external to the semiconductor and therefore may not be formed in the substrate 312. Alternatively, the diode (Dsub) 404 may be formed as part of the integrated circuit included in the semiconductor. The diode (Dsub) 404 may receive only a relatively small predetermined portion of the total current that is possible on the output node 322. Accordingly, the current rating of the diode (Dsub) 404 may be substantially less than the total expected output current of the output signal on output node 322. In one example, the diode (Dsub) 404 may be rated at about twenty percent of the highest expected output current of the output signal on the output node 322. Accordingly, diode (Dsub) 404 may be a practical part to deploy both from a size and cost standpoint.

The difference voltage between the forward voltages of the body diode or substrate diode of the second switching device 306 (LSFET) and the diode (Dsub) 404 may be the measure to which the capacitor (Csub) 406 can be charged to reverse bias the parasitic switching device 334, such as to reverse bias a BJT base-emitter junction. Accordingly, the capacitor (Csub) 406 may act as a temporary reservoir for some of the large free-wheeling current that otherwise would charge the parasitic switching device 334, such as charging the base region of a parasitic BJT, during a parasitic switching device charging event. Delivering the charge to the temporary reservoir can act to de-bias the parasitic switching device 334, as previously discussed.

The capacitor (Csub) 406 may be charged to a voltage that is just below the negative power supply voltage (−Vcc) received as an input voltage on the second power supply input 316. The voltage stored in the capacitor (Csub) 406 may be enough to lower the voltage potential of the substrate 312 a predetermined amount below the negative power supply voltage (−Vcc). The predetermined amount of de-biasing voltage below the negative power supply voltage (−Vcc) may be enough to avoid biasing the parasitic switching device 334 on during a parasitic switching device charging event, without causing shifts in operational characteristics of other devices in the integrated circuit formed in the substrate 312. For example, substantial body-induced threshold shifts in the first and second switching devices 302 and 304 (FETs) that are built in the substrate 312 may be avoided if the de-biasing voltage remains relatively small. Thus, the shift in voltage potential of the substrate 312 may be less than the gate threshold voltage of any device that is built directly on the substrate 312 to reduce the risk of unintended crosstalk through the substrate 312. In one example, the de-biasing voltage stored as a charge on the capacitor (Csub) 406 may be in a range of hundreds of millivolts below the negative power supply voltage (−Vcc). Thus, the voltage potential of the substrate 312 may be shifted in a range of hundreds of millivolts.

The resistor (Rsub) 408 may be coupled in parallel with the capacitor (Csub) 406 and cooperatively operates with the capacitor (Csub) 406 as a charge/discharge circuit. This charge/discharge circuit may be coupled between the second power supply input 316 and the substrate node 320. The resistor (Rsub) 408 may have a resistance value that provides for diversion of any leakage currents flowing within the power stage or reverse bias leakage of the diode (Dsub) 404 in the absence of any forward conduction in the diode Dsub 404. Accordingly, the resistor (Rsub) may be a relatively small resistance, such as in a range of about 1 Ohms to about 100 Ohms.

The capacitor (Csub) 406 may have low equivalent series inductance (ESL) and equivalent series resistance (ESR) with a capacitance which is large compared to a zero bias capacitance of the parasitic switching device 334. In one example, the capacitor (Csub) 406 may be in a range of about 10's of nanoFarads. The capacitance value of the capacitor (Csub) 406 may be increased with the size and number of second switching devices 306 (LSFETs) included in the power stage(s). The capacitor (Csub) 406 may be physically located or placed external to but very near the IC. The internal impedances of bond wires and metalizations in the IC interconnecting the capacitor (Csub) 406 via the second power supply input 316 and the substrate node 320 should be minimized. The physical placement of the resistor (Rsub) 408 and the diode (Dsub) 404 with respect to the IC and the capacitor (Csub) 406 are less sensitive. Alternatively, in other example configurations of the amplifier system, either one or both of the capacitor (Csub) 406 and the resistor (Rsub) 408 may be formed in the substrate as part of the IC.

In another example, the diode (Dsub) 404 may be omitted from the shunt circuit 402 such that only the resistor (Rsub) 408 and the capacitor (Csub) 406 of the charge/discharge circuit are in parallel with the free-wheeling body diode of the second switching device 306. In the absence of the diode (Dsub) 404, the shunt circuit 402 may be designed to rely on the added substrate impedance provided by resistor (Rsub) 408 to allow pumping (charge and discharge) of the capacitor (Csub) 406 using the body diode to substrate conductivity of the second switching device (LSFET) 306. Accordingly, the capacitor (Csub) 406 may be charged to the de-biasing voltage in order to adjust the voltage potential of the substrate 312 an amount to reverse bias the parasitic switching device 334, as previously discussed.

Figure 5:
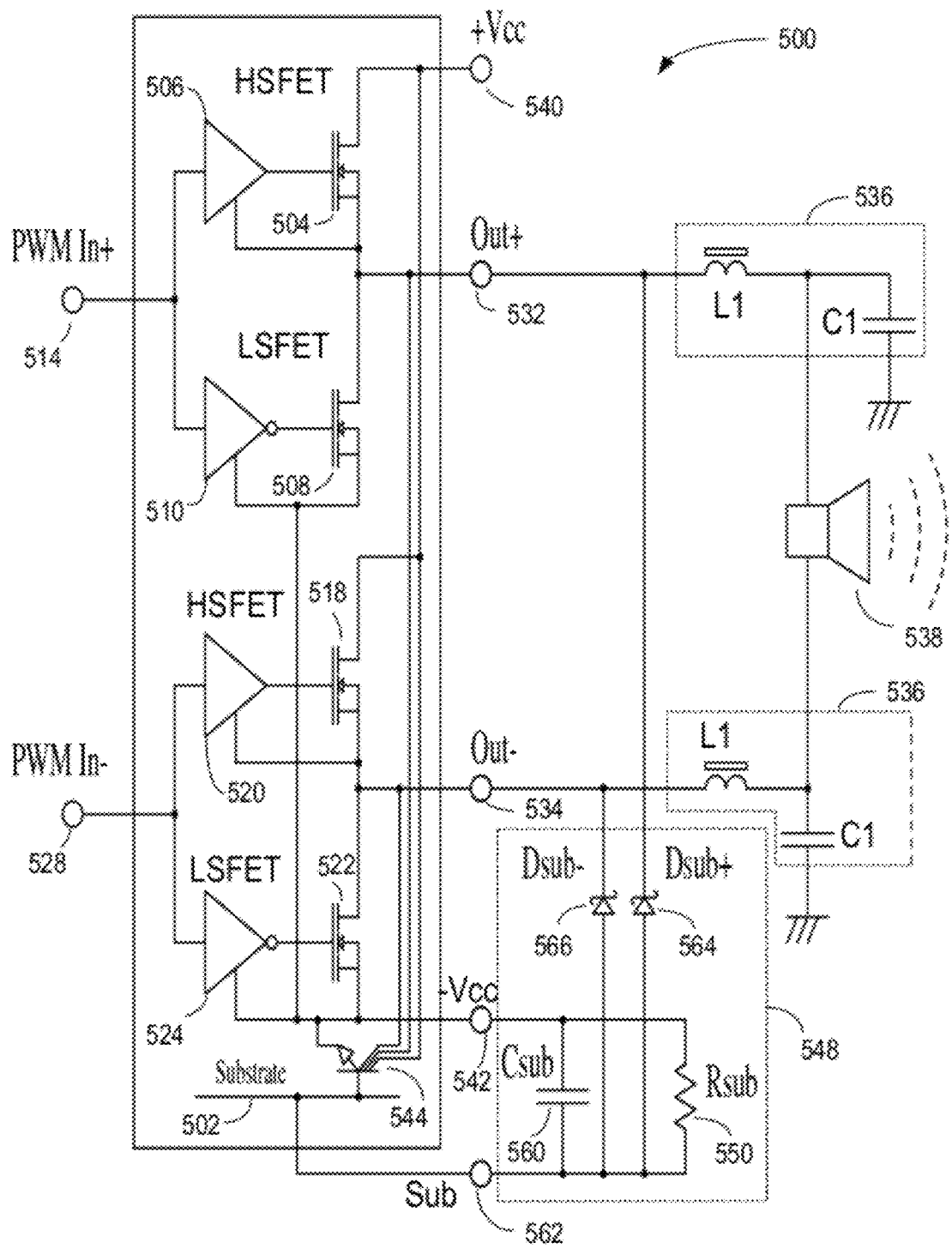
FIG. 5 is a circuit schematic of an example amplifier system that includes a full-bridge power stage and a shunt circuit.

FIG. 5 is another example amplifier system 500 included in a power converter. In this example, the amplifier system 500 includes a full-bridge power stage that is built on a common substrate 502. In FIG. 5, a first switching device 504 is operable with a first gate driver 506, and a second switching device 508 is operable with a second gate driver 510 to form a first half-bridge power stage. The first and second gate drivers 506 and 510 are driven with an input signal, such as a pulse-width modulated signal, on a first input node 514. In addition, a third switching device 518 is operable with a third gate driver 520, and a fourth switching device 522 is operable with a fourth gate driver 524 to form a second half-bridge power stage. The third and fourth gate drivers 520 and 524 are driven with a second input signal, such as a pulse-width modulated signal, on a second input node 528. The first and second input signals may be separate signals, or the first input signal may be inverted to form the second input signal.

The first and second switching devices 504 and 508 may cooperatively operate to generate a first output on a first output node 532, and the third and fourth switching devices 518 and 522 may cooperatively operate to generate a second output on a second output node 534. The first and second outputs may be positive and negative amplified output signals, which are filtered by respective filters 536 and used to drive a load 538. Power supplied by a positive power supply voltage (+Vcc) on a first power supply input node 540 and a negative power supply voltage (−Vcc) on a second power supply input node 542 may be used to generate the first and second output signals. In FIG. 5, during operation one or more parasitic switching devices 544, such as a parasitic BJT may appear in the integrated circuit (IC) contained in the semiconductor. In one example, the parasitic switching device(s) 544 may be parasitic NPN BJTs, and the switching devices may be N channel power MOSFETS, as previously discussed.

The features and alternatives of the previously discussed example amplifier systems are fully, or at least partially applicable to the audio amplifier system 500, and for brevity purposes are not repeated. In other examples, any number of full bridge power stages, or half bridge power stages may be included in an amplifier system of a power converter.

A shunt circuit 548 may also be included in the amplifier system 500. In FIG. 5, the shunt circuit 548 may include a resistor (Rsub) 550, a capacitor (Csub) 560 coupled in parallel and forming a charge/discharge circuit coupled between a substrate node 562 and the second power supply input node 542. The shunt circuit 548 may also include a first diode (Dsub+) 564 coupled between the positive amplified output signal on the first output node 532 and the substrate node 562, and a second diode (Dsub−) 566 coupled between the negative amplified output signal on the second output node 534 and the substrate node 562. The first and second output nodes 532, 534, the first and second power supply input nodes 540 and 542, and the substrate node 562 may be formed as external pins on the semiconductor. Accordingly, the resistor (Rsub) 550, the capacitor (Csub) 560, and the first and second diodes 564 and 566 (if present) may be external to and coupled with the semiconductor, as previously discussed. Alternatively, any of the resistor (Rsub) 550, the capacitor (Csub) 560, and/or the first and second diodes 564 and 566 (if present) may be formed as part of the IC.

The resistor (Rsub) 550 and the capacitor (Csub) 560 may be a shared common charge/discharge circuit used with each of the first and second diodes 564 and 566. Accordingly, other example amplifier systems containing additional channels, can practice the same methods by adding diodes from the additional output nodes and sharing the common charge/discharge circuit formed by the resistor (Rsub) 550 and the capacitor (Csub) 560. Such multi-channel designs may practice phase staggering of the output switching, which poses no problems as each half bridge power stage provides the necessary pump-down (up) capacitive charging to adjust the voltage potential of the substrate) for its respective HSFET turn-on cycle and the small added substrate bias is not problematic to the remaining channels that do not need a pump-down at that particular instant in time. Alternatively, in other examples, multiple charge/discharge circuits may be included in the amplifier system to support the multiple channels.

Similar to the previously discussed examples, the capacitor (Csub) 560 may be charged to a voltage that is just below the negative power supply voltage (−Vcc) (or the positive voltage +Vcc with an n-type substrate) received as an input voltage on the second power supply input node 542. The voltage stored in the capacitor (Csub) 406 may be a de-biasing voltage that adjusts the voltage potential of the substrate 502 to reverse bias the parasitic switching device(s) 544. For example, the de-biasing voltage may lower the voltage potential of the substrate 502 below the negative power supply voltage (−Vcc) enough to avoid biasing of the parasitic switching device(s) 544 during a parasitic switching device charging event occurring in any one of the half-bridge power stages.

In another example, the first and second diodes (Dsub) 564 and 566 may be omitted from the shunt circuit 548. In the absence of the first and second diodes (Dsub) 564 and 566, the shunt circuit 548 may be designed to rely on the added substrate impedance provided by resistor (Rsub) 550 to allow pumping of the capacitor (Csub) 560 using the body diode to substrate conductivity of the second switching devices (LSFETs) 508 and 522. Accordingly, the capacitor (Csub) 560 may be charged to the de-biasing voltage in order to adjust the voltage potential of the substrate 502 a predetermined amount with respect to the negative power supply voltage (−Vcc) in order to reverse bias the parasitic switching device 544. Multi-channel power converters may similarly be designed to omit the diodes (Dsub) from the respective channels.

Figure 6:
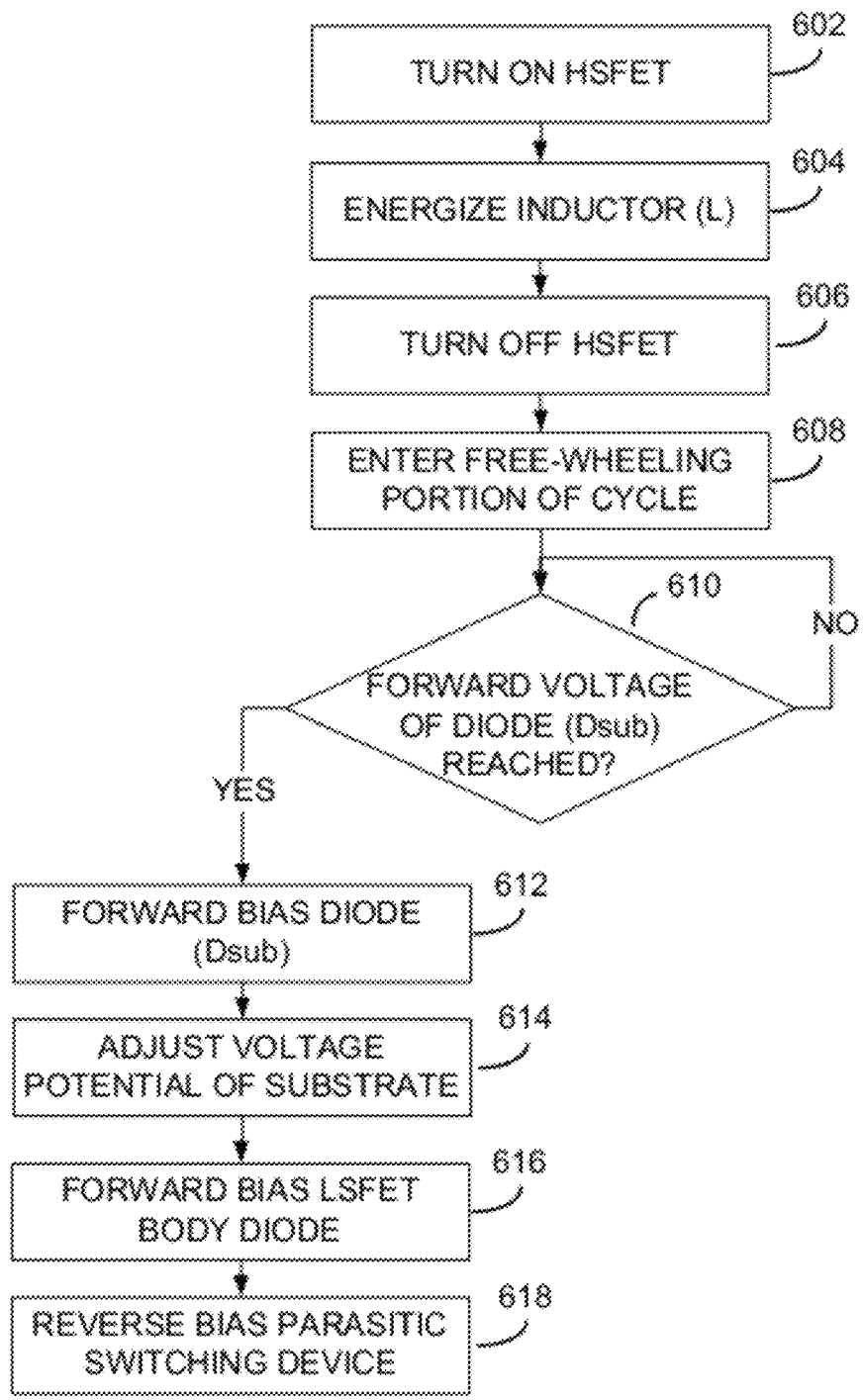
FIG. 6 is an operation flow diagram of an amplifier system.

FIG. 6 is an operational flow diagram of an example amplifier system described as previously discussed with reference to FIGS. 1-5. The operation begins at block 602, when a first switching device (HSFET) is turned on, and voltage and current are supplied as an amplified output signal on an output node for supply to a load. The voltage in the output signal is applied to the inductor (L) in the filter, and energizes the inductor (L) at block 604. The first switching device (HSFET) is turned off at block 606, and a second switching device (LSFET) is not yet turned on within a half-bridge power stage of a power converter. At block 608, the half-bridge power stage enters the free-wheeling portion of the power conversion cycle where the inductor (L) is de-energized and current is generated.

The forward voltage of the diode (Dsub) is reached or not reached at the output node at block 610 based on the current generated in the inductor (L) and the voltage present at the output node. If the forward voltage of the diode (Dsub) is not reached, the diode Dsub remains off and the operation returns to block 610. If the forward voltage of the diode (Dsub) is reached, the diode Dsub turns on and begins conducting current to the substrate node at block 612. The voltage potential of the substrate is adjusted at block 614 to be below the negative supply voltage (−Vcc) by charging the capacitor (Csub). At block 616, the body diode of the second switching device (LSFET) is turned on and begins to conduct and free-wheeling current flows into the body diode of the second switching device (LSFET). The parasitic switching device is reversed biased by the adjusted substrate voltage and remains turned off at block 618. Operation on an n-type substrate can be understood by interchanging the terms HSFET with LSFET, above with below and +Vcc with −Vcc in the foregoing description. In such circumstance the parasitic device can be, for example, a PNP BJT.

The previously discussed examples of an amplifier system include an integrated circuit having a substrate with a plurality of cooperatively operating power switching devices formed in the substrate to provide amplification of an input signal. The amplifier system may also include a shunt circuit having a substrate charge/discharge circuit and one or more substrate diodes that may be located external to the IC. The substrate diode(s) may be turned on during a free-wheeling portion of a switching cycle of the power switching devices to charge the substrate capacitor and thereby adjust a voltage potential of the substrate. The voltage potential of the substrate may be adjusted to reverse bias one or more parasitic switching devices that appear in the IC during the free-wheeling portion of the switching cycle. Accordingly, full turn on of the one or more parasitic switching devices and the subsequent possibility of failure in the integrated circuit may be minimized or avoided.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. An amplifier system for a power converter comprising:
   a semiconductor having an integrated circuit formed in a substrate;
   a plurality of switching devices that include a first switching device and a second switching device included in the integrated circuit;
   the first switching device and the second switching device cooperatively switchable with a pulse-width modulated signal to generate an amplified signal using a first power supply input and a second power supply input; and
   a capacitor and a resistor coupled in parallel, and coupled between one of the first power supply input or the second power supply input and the substrate.

2. The amplifier system of claim 1, further comprising a diode coupled between the amplified signal and the substrate.

3. The amplifier system of claim 2, where the diode is a Schottky diode that is external to the semiconductor.

4. The amplifier system of claim 1, where the first switching device and the second switching device each include a body diode coupled between a drain and a source of each of the first switching device and the second switching device, the body diode operable to be forward biased by a free-wheeling current during switching of the respective first switching device and the second switching device, and the resistor and capacitor are operable as a shunt circuit in parallel with the body diode of the second switching device.

5. The amplifier system of claim 1, where the resistor and the capacitor are devices external to the semiconductor.

6. The amplifier system of claim 1, where the resistor and the capacitor are devices formed in the substrate.

7. An amplifier system for a power converter comprising:
   an integrated circuit formed in a substrate, the substrate having a substrate input;
   a plurality of switching devices included in the integrated circuit;
   the switching devices comprising a first switching device and a second switching device that are cooperatively switchable with a pulse-width modulated signal to generate an amplified signal;
   a first power supply input coupled with the first switching device, and a second power supply input coupled with the second switching device;
   a resistor coupled between the second power supply input and the substrate input; and
   a capacitor coupled between the second power supply input and the substrate input, the capacitor also coupled in parallel with the resistor.

8. The amplifier system of claim 7, where the first switching device and the second switching device are each a power MOSFET formed in the substrate.

9. The amplifier system of claim 7, where the second power supply input is configured to receive a power supply voltage at a most negative supply voltage potential of the second switching device, and the second switching device comprises a NMOS FET.

10. The amplifier system of claim 7, where the second power supply input is configured to receive a power supply voltage at a most positive voltage supply potential of the second switching device, and the second switching device comprises a PMOS FET.

11. The amplifier system of claim 7, further comprising a diode coupled between the amplified signal and the substrate, the diode operable with the capacitor and the resistor to selectively shunt at least some of a current of the amplified signal to the substrate.

12. The amplifier system of claim 11, where the diode is configured with a blocking voltage rating of at least a difference in voltage expected between the first and second power supply inputs, and a forward voltage less than a forward voltage of a body diode included in the second switching device.

13. The amplifier system of claim 11, where the diode is a first diode, the amplified signal is a first amplified signal suppliable to a load, and the plurality of switching devices further comprises a third switching device and a fourth switching device cooperatively switchable with the pulse-width modulated signal to generate a second amplified signal suppliable to the load, the amplifier system further comprising a second diode coupled between the second amplified signal and the substrate.

14. The amplifier system of claim 13, where the resistor and the capacitor form a charge discharge circuit, the charge discharge circuit independently operable with each of the first diode and the second diode to adjust a voltage potential of the substrate.

15. The amplifier system of claim 11, where the diode, the resistor and the capacitor are external to the semiconductor, and operable as a shunt circuit in parallel with a body diode included in the second switching device.

16. The amplifier system of claim 7, where the capacitor is operable as a voltage storage reservoir to adjust a voltage potential of the substrate in response to a parasitic switching device charging event.

17. An amplifier system for a power converter comprising:
   a resistor;
   a capacitor coupled in parallel with the resistor to form a charge/discharge circuit;

the resistor and the capacitor coupled between a substrate of a semiconductor and a first switching device formed in the substrate of the semiconductor; and the first switching device also coupled with a second switching device formed in the substrate of the semiconductor so that the charge/discharge circuit, the first switching device, the second switching device and the substrate are coupled in series;

where the first switching device and the second switching device are operable to generate an amplified output signal in response to a pulse width modulated control signal.

18. The amplifier system of claim 17, where the semiconductor comprises a first external pin that is a substrate node and a second external pin that is a power supply node, and the charge/discharge circuit is coupled between the substrate node and the power supply node external to the semiconductor.

19. The amplifier system of claim 18, where the power supply node is configured to receive a voltage from a power supply, the voltage being a most negative voltage received by the semiconductor, and the first and second switching devices being N channel power MOSFETs.

20. The amplifier system of claim 18, further comprising a diode connected between the substrate node and a third external pin of the semiconductor that is an output node, where the first switching device and the second switching device are operable to produce an amplified output signal on the output node.

21. The amplifier system of claim 17, where the capacitor is configured to be charged to a de-biasing voltage to adjust a voltage potential of the substrate to reverse bias any parasitic switching device that appears in the substrate.

22. The amplifier system of claim 17, where the capacitor is configured to be chargeable in response to entry of the first and second switching devices into a free-wheeling portion of a switching cycle in which both the first switching device and the second switching device are substantially non-conducting.

23. A method of operating an amplifier system of a power converter, the method comprising:

cooperatively operating a first switching device and a second switching device formed in a substrate of a semiconductor to generate an amplified output signal on an output node;

turning off one of the first switching device and the second switching device;

entering a free-wheeling portion of a switching cycle in which at least one of the first switching device or the second switching device are non-conducting;

charging a capacitor coupled between the substrate node and a power supply node of the semiconductor with a free-wheeling current produced during the switching cycle; and adjusting a voltage potential of the substrate in accordance with a de-biasing voltage stored in the capacitor.

24. The method of claim 23, further comprising forward biasing a diode coupled between the output node and a substrate node of the semiconductor in accordance with the free-wheeling current to charge the capacitor.

25. The method of claim 23, where adjusting the voltage potential of the substrate comprises lowering the voltage potential of the substrate below a most negative supply potential of the second switching device.

26. The method of claim 23, where adjusting the voltage potential of the substrate comprises reverse biasing any parasitic switching devices appearing in the substrate.

27. The method of claim 23, where charging the capacitor comprises operating the capacitor and the resistor to shunt at least some of a current present on the output node to the substrate.

* * * * *